United States Patent [19]

Cline et al.

[11] Patent Number: 4,611,886
[45] Date of Patent: Sep. 16, 1986

[54] INTEGRATED OPTICAL CIRCUIT PACKAGE

[75] Inventors: Terry W. Cline, Bethlehem, Pa.; Michael A. Karr, III, New Providence; Frank H. Levinson, Whippany, both of N.J.

[73] Assignee: AT&T Bell Laboratories, Murray Hill, N.J.

[21] Appl. No.: 566,684

[22] Filed: Dec. 29, 1983

[51] Int. Cl.4 ............ H01L 31/12; H04N 9/27; H01J 5/16; G02B 6/36

[52] U.S. Cl. ............ 350/96.20; 350/96.10; 350/96.21; 350/320; 250/227; 357/72; 357/19

[58] Field of Search ........ 350/96.20, 96.10, 96.21, 350/820; 250/227, 551; 357/72, 75, 19; 65/4.3; 29/569 L

[56] References Cited

U.S. PATENT DOCUMENTS

| | | | |
|---|---|---|---|
| 3,780,352 | 12/1973 | Redwanz | 357/75 X |
| 4,007,978 | 2/1977 | Holton | 350/96 WG |
| 4,100,422 | 7/1978 | Thillays | 250/551 |
| 4,173,389 | 11/1979 | Curtis | 350/96.20 |
| 4,225,213 | 9/1980 | McBride, Jr. et al. | 350/96.20 |
| 4,373,778 | 2/1983 | Adham | 350/96.20 |
| 4,396,935 | 8/1983 | Schuck | 357/80 X |

*Primary Examiner*—William L. Sikes
*Assistant Examiner*—Akm E. Ullah
*Attorney, Agent, or Firm*—Lester H. Birnbaum

[57] ABSTRACT

A packaging scheme for apparatus including integrated optical components, such as transmitters, receivers and transceivers. The components are provided in the form of semiconductor chips bonded to a substrate such as ceramic. A glass cover which includes a light transmission path is mounted over the chips. Connectors to optical fibers are formed by molding a material over the substrate and cover. Alignment is effected by use of etched grooves in the cover which are matched to ridges in the mold.

16 Claims, 5 Drawing Figures

INTEGRATED OPTICAL CIRCUIT PACKAGE

BACKGROUND OF THE INVENTION

This invention relates to optical fiber communications systems and in particular to a structure and method of packaging apparatus including integrated optical components.

In the fabrication of optical apparatus such as transmitters, receivers, and transceivers utilizing integrated components, considerable attention must be given to packaging, and in particular to the means of optical alignment of the components with each other and with the optical fiber. Coupling and reflection losses should be kept to a minimum, while cost effectiveness remains an important factor. Further, the ability to use a package concept for a variety of different types of apparatus contributes to cost minimization for the system.

It is therefore an object of the invention to provide a package for integrated optical components.

SUMMARY OF THE INVENTION

This and other objects are achieved in accordance with the invention, which in its structural aspect, is an optical apparatus for use in fiber optical systems. The apparatus comprises a plurality of components formed in semiconductor chips which are bonded to a substrate. A glass cover is placed over the optical components. The cover includes a light transmission path formed therein and also includes alignment features formed in one surface. A molded material is formed over the substrate and cover. This material includes, at one end of the light transmission path, a connector portion which is adapted to receive an optical fiber therein.

In accordance with its method aspect, the invention is a method of fabricating optical apparatus including components formed in semiconductor chips for use in fiber optical systems. The method comprises bonding the chips to the substrate and placing a glass cover over the chips. The cover includes a light transmission path, and alignment features formed in one surface. The resulting structure is inserted in a mold which includes a portion for forming a connector element at one end of the light transmission path. The mold also includes alignment features adapted to engage the alignment features in the cover so that the structure is properly aligned in the mold with the connector-forming portion. A material is then molded over the substrate and cover.

BRIEF DESCRIPTION OF THE DRAWINGS

These and other features of the invention are delineated in detail in the following description. In the drawing.

It will be appreciated that for purposes of illustration these figures are not necessarily drawn to scale.

DETAILED DESCRIPTION

Figure 1:
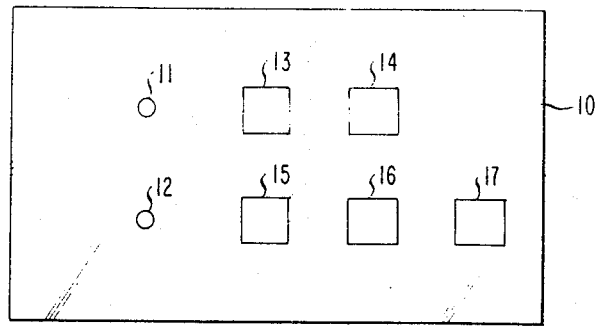
FIG. 1 is a top schematic view of optical apparatus during one stage of fabrication in accordance with one embodiment of the invention.
Figure 2:
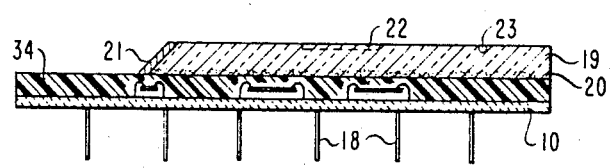
FIG. 2 is a cross-sectional schematic view of the apparatus at a further stage in fabrication in accordance with the same embodiment.

The basic principles of the invention will be described with reference to the embodiment schematically illustrated in FIGS. 1-5. As illustrated in the top view of FIG. 1, the various components are provided in the form of semiconductor chips bonded to a substrate, 10, which in this case is ceramic (see also the cross-sectional view of FIG. 2). The substrate is typically 20 mm long, 10 mm wide and 1 mm thick. In this example, a transceiver is shown, with the light emitting diode and photodiode shown, schematically, as 11 and 12, respectively. Various other components are also illustrated. For example, chip, 13, can be the driver for the LED and chip, 14, an encoder. Further, chips, 15 and 16, can be an amplifier and comparator for the receiver portion and chip, 17, a decoder. It will be appreciated that fewer or greater numbers of components can be provided according to particular needs. All chips may be bonded to the substrate, 10, by epoxy bonding techniques and electrically connected to conductors on the substrate (not shown) by wire bonding to contacts on the chip surfaces according to standard technology. As shown in FIG. 2, electrical contact to portions outside the substrate can be provided by pins, 18, which are formed according to standard hybrid integrated circuit technology. A thin layer of a protective coating, 34, such as a clear room temperature vulcanizing silicone rubber (RTV) can also be formed over the substrate and components.

Figure 3:
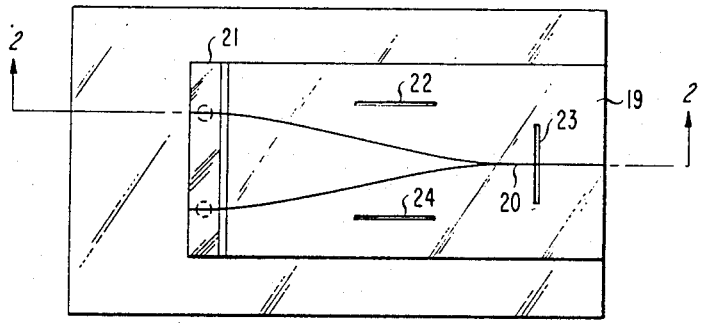
FIG. 3 is a top schematic view of the apparatus in the same stage as that of FIG. 2.

As further illustrated in FIG. 2 and the top view of FIG. 3, a glass cover, 19, is provided over the components and rests on the RTV coating. In the major surface of the cover adjacent to the components is a light transmission path, 20, which in this example is a standard waveguide formed by ion exchange of silver for sodium in the glass. As shown, the waveguide forms a Y-configuration to provide a light path from the LED to the edge of the glass cover and from the photodiode to the edge of the glass cover. In a typical embodiment, the cover measures 15 mm×5 mm×1 mm and the waveguide is approximately 45 μm wide and formed to a depth of approximately 45 μm in the surface of the cover.

The edge of the cover which is positioned over the LED and photodiode is cut to form an inclined surface (typically at an angle of 45°) upon which is formed a mirror, 21, by standard evaporation techniques. This mirrored surface allows light to be coupled out of the LED into the waveguide and out of the waveguide into the photodiode. If desired, the mirror, 21, could extend over the top surface of the cover to provide an EMI shield, in which case the mirror would be electrically connected to ground.

Formed on the major surface of the glass cover opposite to the components are grooves, 22-24, which are used for alignment purposes in the molding operation to be described. The grooves are formed by standard photolithographic techniques. That is, a photoresist layer is deposited over a metallic masking layer on the cover surface and exposed through a photolithographic mask to establish the groove pattern. The pattern is then formed in the metallic masking layer by etching and then the grooves are etched in the glass layer with the metal layer used as a mask. The grooves are typically etched to a depth of approximately 100 μm and are approximately 200 μm wide.

Figure 4:
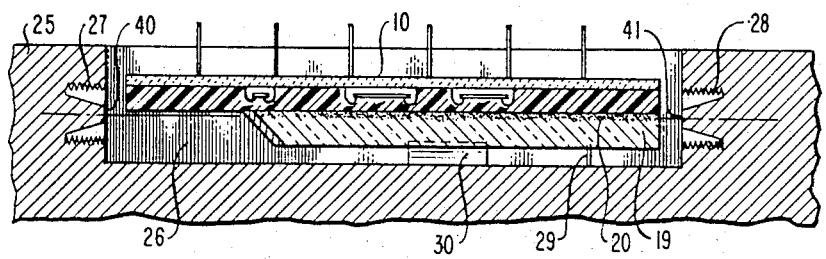
FIG. 4 is cross-sectional view of the apparatus at a still later stage of fabrication in accordance with the same embodiment.

Next, as shown in FIG. 4, the substrate and cover assembly is inserted into a mold, a portion of which is shown in cross section as 25. The mold is shown as a single unit, but would typically include two pieces which are brought in contact during the molding and separated to allow removal of the molded piece. The cavity, 26, includes portions, 27 and 28, with inside surfaces in the shape of truncated cones, 40 and 41. The axis of each cone is aligned with the light transmission path at the edge of the cover, 19. This alignment is effected by ridges, such as, 29 and 30, formed in the floor of the cavity in a configuration which matches the grooves, 22-24, in the glass cover. The ridges are placed in the cavity so that upon engagement with their associated grooves in the cover, the cover-substrate assembly is precisely aligned in the cavity. Thus, the inaccuracies inherent in machining of molds are compensated for by the formation of the grooves made to fit the mold by the far more accurate photolithographic process.

The mold is then filled with a desired protective material such as a thermosetting plastic (e.g., silicone or epoxy) and cured with an appropriate heating cycle.

Figure 5:
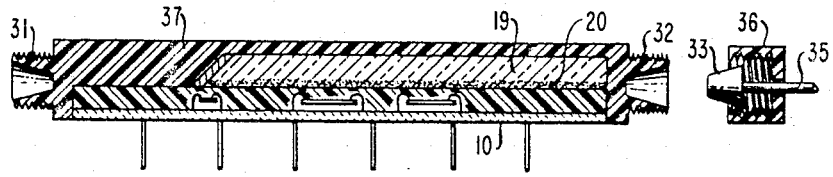
FIG. 5 is a cross-sectional view of the apparatus at a final stage of fabrication in accordance with the same embodiment.

The resulting structure is illustrated in the cross-sectional view of FIG. 5. The molded material, 37, forms a protective covering over the entire substrate, 10, and surrounds the glass cover, 19, and optical components, 11-17. The molding material also forms, in this example, a connector portion, 32, aligned with the light transmission path, 20, at one edge of the glass cover. Another connector portion, 31, is provided at the other edge. Although this portion is not used in the transceiver embodiment, it may be included in the standard mold in the event that the optical components are arranged to form an optical tap. This class of devices requires two optical connections in the same package. The connector portions have a conical shape so that they may receive the standard conical connectors, 33, used for optical fibers, 35. The outer surface of each connector portion may be threaded as shown so that a cap, 36, may be screwed on to secure the fiber connector to the connector portion. It will be appreciated that other shapes of connector portions, 31 and 32, may be molded to accommodate different shapes of fiber connectors.

In this example, connector, 32, receives the optical fiber for light transmission from the LED or to the photodiode. It will be appreciated that connector, 31, is optional and may be eliminated if desired. On the other hand, additional connector portions might also be provided as needed. In a typical embodiment, connector portions, 31 and 32, define a cone with a height of approximately 0.5 inch, and a diameter at its base of approximately 0.25 inch. The final package would be approximately 1.5 inches long, 1 inch wide and approximately 0.375 inch thick.

It should be appreciated that, although a transceiver is described for illustrative purposes, the invention is applicable to any other optical apparatus employing integrated components, such as transmitters and receivers. It will also be appreciated that the assembly can be aligned in the mold by forming ridges on the glass cover and mating grooves in the mold cavity, rather than forming grooves on the cover and ridges in the mold, although the latter is preferred.

Various additional modifications will become apparent to those skilled in the art. All such variations which basically rely on the teachings through which the invention has advanced the art are properly considered within the spirit and scope of the invention.

What is claimed is:

1. Optical apparatus for use in a fiber optical system comprising:
   a plurality of components formed in semiconductor chips bonded to a substrate;
   a glass cover formed over the optical components and including a light transmission path formed therein, said cover also including means formed in one surface for aligning said cover in a mold; and
   a molded material formed over said substrate and cover and including at one end of the light transmission path a connector portion having means for receiving an optical fiber so that the fiber is aligned with said light transmission path.

2. The apparatus according to claim 1 wherein the connector portion defines a truncated cone for receiving a conical optical fiber connector.

3. The apparatus according to claim 2 wherein the connector portion includes threads on its outer surface to permit screwing a cap thereon to secure the connector.

4. Apparatus according to claim 1 wherein the substrate comprises ceramic.

5. Apparatus according to claim 1 wherein the light transmission path comprises a waveguide formed in one surface of the glass cover.

6. Apparatus according to claim 1 wherein the glass cover includes an inclined edge with a mirror formed thereon for coupling light between the transmission path and at least one of the components.

7. Apparatus according to claim 1 wherein the molded material comprises thermosetting plastic.

8. Apparatus according to claim 1 further comprising an adddditional connector portion at the opposite end of the cover from the first connector portion.

9. Apparatus according to claim 1 wherein the components include a light emitting device and a photodetector arrayed with respect to the light transmission path so as to form a transceiver.

10. An optical transceiver for use in a fiber optical system comprising:
    a plurality of optical components, including a light emitting diode and a photodetector, formed in semiconductor chips bonded to an insulating substrate;
    a glass cover formed over the optical components and including a waveguide in a Y configuration in the major surface of the cover adjacent to the optical components, said cover further including an inclined surface at one edge with a mirror formed thereon to permit coupling of light between the waveguide and the light emitting device and photodetector, said cover further including grooves formed in the major surface opposite to the optical components; and
    a molded material formed over said substrate and cover and including at least one connector portion at one edge of the cover and aligned with the waveguide at an end opposite to that above the light emitting device and photodetector, the connector defining a truncated cone for insertion therein of a conical connector attached to an optical fiber.

11. A method of fabricating optical apparatus including components formed in semiconductor chips for use in a fiber optical system, the method comprising the steps of:

bonding said chips to an insulating substrate;

forming over said chips a glass cover which includes a light transmission path formed therein and alignment features formed in one surface of said cover;

inserting the resulting structure in a mold which includes a portion for forming a connector element at one end of the light transmission path and further includes alignment features adapted to engage the alignment features in the cover so that the structure is properly aligned in the mold with the connector forming portion; and molding a material over the substrate and cover.

12. The method according to claim 11 wherein the alignment features are grooves formed in the surface of the cover by photolithography and ridges formed in the mold cavity.

13. The method according to claim 11 wherein the portion for forming a connector element has an inside surface defining a truncated cone and the alignment features are arranged so that one end of the transmission path is aligned with the axis of the cone.

14. The method according to claim 11 wherein the light transmission path is a waveguide formed in the surface of the cover adjacent to the components by diffusion of ions therein.

15. The method according to claim 11 wherein the material is molded by adding a material comprising thermosetting plastic to the mold and curing.

16. The method according to claim 11 wherein the components include a light emitting device and a photodetector, and the light transmission path is a waveguide formed in a Y configuration with one end aligned above the light emitting device, one end aligned above the photodetector and one end aligned with the connector element.

* * * * *